United States Patent [19]

Yamazaki et al.

[11] Patent Number: 4,706,376
[45] Date of Patent: Nov. 17, 1987

[54] METHOD OF MAKING SEMICONDUCTOR PHOTOELECTRIC CONVERSION DEVICE

[75] Inventors: Shumpei Yamazaki; Susumu Nagayama, both of Tokyo, Japan

[73] Assignee: Semiconductor Energy Laboratory Co., Ltd., Kanagawa, Japan

[21] Appl. No.: 932,082

[22] Filed: Nov. 18, 1986

Related U.S. Application Data

[62] Division of Ser. No. 725,742, Apr. 22, 1985.

[30] Foreign Application Priority Data

Apr. 20, 1984 [JP] Japan ................... 59-79622

[51] Int. Cl.[4] ........................ H01L 31/18
[52] U.S. Cl. ...................... 437/4; 136/258; 357/30; 357/59; 148/DIG. 90; 148/DIG. 94; 437/101; 437/233
[58] Field of Search ............... 29/572, 576 B; 148/1.5, 148/DIG. 90, DIG. 94; 136/258 AM, 258 PC; 357/30, 59 C

[56] References Cited

U.S. PATENT DOCUMENTS 4,539,431  9/1985  Moddel et al. ................. 136/259

OTHER PUBLICATIONS

R. Tsu et al, *IBM Tech. Disc. Bull.*, vol. 21 (No. 11), p. 4691 (Apr. 1979).

*Primary Examiner*—Aaron Weisstuch
*Attorney, Agent, or Firm*—Gerald J. Ferguson, Jr.; Michael P. Hoffman; Michael J. Foycik

[57] ABSTRACT

A method for manufacturing a semiconductor photoelectric conversion device including forming a first impurity doped non-single crystal semiconductor layer of a first conductivity type on a substrate; forming an intrinsic non-single crystal semiconductor layer on the first semiconductor layer; forming a second impurity doped non-single crystal second conductivity layer type opposite to the first conductivity type on the intrinsic layer; irradiating the outer surface of the second impurity doped semiconductor layer with light energy of suitable wavelength which is effective to selectively crystallize the second impurity doped layer; irradiating the outer surface of the second impurity doped semiconductor layer with light energy of suitable wavelength which is effective to selectively crystallize the intrinsic semiconductor layer, whereby only the portion of the intrinsic semiconductor layer adjacent the impurity doped semiconductor layer is crystallized.

1 Claim, 14 Drawing Figures

METHOD OF MAKING SEMICONDUCTOR PHOTOELECTRIC CONVERSION DEVICE

This is a divisional application of Ser. No. 725,742, filed Apr. 22, 1985.

BACKGROUND OF THE INVENTION

1. Field of the Invention

The present invention relates to a semiconductor photoelectric conversion device which has at least one PIN structure in which a first conductivity type (P- or N-type) non-single-crystal semiconductor layer, an I-type non-single-crystal semiconductor layer, and a second conductivity type (opposite from the first conductivity type) non-single-crystal semiconductor layer are sequentially laminated in that order. Further, the present invention pertains to a method for the manufacture of such a semiconductor photoelectric conversion device.

2. Description of the Prior Art

Heretofore a variety of semiconductor photoelectric conversion devices have been proposed which are of the type having at least one PIN structure mentioned above.

With this kind of devices, light incident thereto creates carriers, that is, electron-hole pairs in the I-type layer and the electrons and holes flow into one of the first and second conductivity type layers, that is, the N-type layer, and into the other, that is, the P-type layer, respectively, developing photovoltage. Accordingly, in order to obtain a high photoelectric conversion efficiency, it is desired that the I-type layer of the PIN structure have no recombination centers with which the carriers combine. To this end, it is the general practice in the prior art to dope the I-type layer of the PIN structure with hydrogen or a halogen as a recombination center neutralizer.

Nevertheless, a relatively large number of recombination centers remain unextinguished in the vicinities of the boundaries between the I-type layer and the P-type layer and between the I-type layer and the N-type layer. These remaining recombination centers cause losses of the electrons and holes flowing toward the N-type and P-type layers, respectively. Therefore, the prior art devices have the defect of low photoelectric conversion efficiency although the I-type layer of the PIN structure is doped with the recombination center neutralizer.

SUMMARY OF THE INVENTION

It is therefore an object of the present invention to provide a novel semiconductor photoelectric conversion device which achieves a high photoelectric conversion efficiency.

Another object of the present invention is to provide a novel manufacturing method which permits easy fabrication of a semiconductor photoelectric conversion device of high photoelectric conversion efficiency.

The semiconductor photoelectric conversion device of the present invention includes, as is conventional, at least one PIN structure in which a first conductivity type non-single-crystal semiconductor layer, an I-type non-single-crystal semiconductor layer and a second conductivity type (opposite from the first conductivity type) non-single-crystal semiconductor layer are sequentially laminated in that order. The I-type layer is doped with a recombination center neutralizer.

In accordance with an aspect of the present invention, however, the I-type layer of the PIN structure is crystallized in its regions near the boundaries between the I-type layer and the first and/or second conductivity type layer. The above crystallization means that when the I-type layer is formed of amorphous silicon, it is rendered into a microcrystalline or polycrystalline semiconductor, or a mixture thereof, and that when the I-type layer is of crystalline semiconductor, it is rendered into a microcrystalline semiconductor of a large grain size, or a polycrystalline semiconductor.

With such a device of the present invention, when it is irradiated by light, carriers are generated in the I-type layer of the PIN structure. The carriers, i.e. electrons and holes, flow into the N-type and P-type layers, respectively, yielding photovoltaic power.

In this case, since the I-type layer has its regions crystallized near the boundaries between it and the N-type and/or P-type layer, the number of recombination centers is far smaller than in the case where such regions are not crystallized. On account of this, the carriers, that is, the electrons and/or holes created in the I-type layer, reach the N and/or P-type layers with a high efficiency, respectively.

Further, although the I-type layer has the abovesaid regions crystallized, since the other region is not crystallized and is higher in light absorptivity than the crystallized regions, the carrier generating ratio in the I-type layer is reduced only very slightly.

In accordance with another aspect of the present invention, the I-type layer of the PIN structure is crystallized throughout it. In this case, the crystallized semiconductor is grown in many columnar forms extending between the first and second conductivity type semiconductor layers. With such a device of the present invention, since the I-type layer is crystallized throughout it, the photocarrier generating ratio is lower than in the case where the I-type layer is not crystallized, but this can easily be compensated by increasing the thickness of the I-type layer. Further, the carriers or electrons and holes reach the N-type and P-type layers efficiently, respectively. This is marked especially when the crystallized semiconductor is grown in many columnar forms.

In accordance with another aspect of the present invention, the I-type layer is crystallized at least in its regions near the boundaries between it and the N-type and/or P-type layer, and the N-type and/or P-type layer is crystallized.

With such a device of the present invention, since the boundaries between the I-type layer and the N-type and/or P-type layer are formed by the crystallized region of the I-type layer and the crystallized N-type and/or P-type layer, the boundaries are crystallographically fit, ensuring that the electrons and holes developed in the I-type layer efficiently reach the N-type and P-type layers respectively. Further, since the N-type and/or P-type layer is crystallized, the N-type and/or P-type layer less absorbs light incident to the I-type layer than in the case where the N-type and/or P-type layer is not crystallized.

Thus, the semiconductor photoelectric conversion device of the present invention achieves a higher photoelectric conversion efficiency than does the conventional devices.

The semiconductor photoelectric conversion device manufacturing method of the present invention includes, as is conventional, a step of forming, on a substrate having a conductive surface, at least one PIN structure in which a first conductivity type non-single-crystal semiconductor layer, an I-type non-single-crystal semiconductor layer doped with a recombination center neutralizer, and a second conductivity type non-single-crystal semiconductor layer sequentially laminated in that order, and a step of forming a electrode on the PIN structure.

In accordance with an aspect of the manufacturing method of the present invention however, a transparent substrate is used as the abovesaid substrate, and before or after the electrode forming step, the PIN structure is exposed to irradiation by light for annealing, through the transparent substrate, by which a region of the I-type layer in the vicinity of the boundary between it and the first conductivity type layer or/and the entire region of the latter is crystallized, or the entire region of the I-type layer or/and the first conductivity type layer is crystallized. In this case, the electrode is formed by a transparent conductive layer of a metal oxide, or a reflective conductive layer of metal. The electrode can be formed as a two-layer structure which has a reflective conductive layer laminated on a transparent conductive layer.

In accordance with another aspect of the manufacturing method of the present invention, prior to the formation of the electrode, the PIN structure is irradiated by light for annealing from the side opposite from the substrate, by which the region of the I-type layer near the boundary between it and the second conductivity type layer or/and the entire region of the latter is crystallized, or the entire region of the I-type layer or/and the second conductivity type layer is crystallized.

In accordance with another aspect of the manufacturing method of the present invention, the electrode is formed as a transparent layer, and after the formation of the transparent electrode, the PIN structure is irradiated by light for annealing through the transparent electrode, by which the region of the I-type layer near the boundary between it and the second conductivity type layer or/and the entire region of the latter is crystallized, or the entire region of the I-type layer or/and the second conductivity type layer is crystallized. In this case, a reflective conductive layer can be laminated on the transparent electrode after the formation of the latter.

In accordance with another aspect of the manufacturing method of the present invention, a transparent substrate is used, and before the electrode forming step, the PIN structure is irradiated by light for a first annealing through the transparent substrate, and at the same time as or before or after it, the PIN structure is irradiated, from the side opposite from the transparent substrate, by a second annealing light of a wavelength equal to or different from the first annealing light, thereby crystallizing the region of the I-type layer near the boundary between it and the first conductivity type layer or/and the entire region of the latter, the region of the I-type layer near the boundary between it and the second conductivity type layer or/and the entire region of the latter.

In accordance with yet another aspect of the manufacturing method of the present invention, a transparent substrate, and a transparent electrode are used. After the transparent electrode layer forming step, the PIN structure is irradiated by a first annealing light through the transparent substrate, and at the same time as or before or after it, the PIN structure is irradiated, from the side opposite from the transparent substrate, by a second annealing light of a wavelength equal to or different from the first annealing light, thereby crystallizing the region of the I-type layer near the boundary between it and the first conductivity type layer or/and the entire region of the latter, the region of the I-type layer near the boundary between it and the second conductivity type layer or/and the entire region of the latter.

The manufacturing method of the present invention permits easy fabrication of the semiconductor photoelectric conversion device of the present invention which has the abovesaid excellent features.

Other objects features and advantages of the present invention will become more fully apparent from the following detailed description taken in conjunction with the accompanying drawings.

DESCRIPTION OF THE PREFERRED EMBODIMENTS

FIGS. 1 to 5 illustrate first, second, third, fourth, and fifth embodiments of the photoelectric conversion device of the present invention, in which a transparent electrode 2 of a conductive oxide such as tin oxide is deposited, for example, by means of an evaporation method, on a transparent substrate 1 made of a transparent insulating material such as glass.

The transparent electrode 2 has formed thereon a PIN structure 3.

The PIN structure 3 comprises P-type, I-type, and N-type non-single-crystal semiconductor layers 3P, 3I, and 3N which are laminated in that order, for instance.

The P-type layer 3P is formed of, for example, Si, $Si_xC_{1-x}(0 < X < 1)$, $Si_3N_{4-x}(0 < X < 4)$, $SiO_{2-x}(0 < X < 2)$ and has a thickness of, for instance, 100 to 200 Å. The I-type 3I is formed of, for instance, Si, Ge, $Si_xGe_{1-x}(0 < X < 1)$ and has a thickness of, for example, 0.4 to 1.0 μm. The N-type layer 3N is formed of, for example, silicon and has a thickness of, for instance, 200 to 500 Å.

The P-type layer 3P is formed in a reaction chamber by means of a known CVD method such as low temperature CVD, photo CVD, plasma CVD or like method, using a semiconductor material gas(es) and a P-type impurity material gas as diborane ($B_2H_6$). The I-type layer 3I is formed in the same reaction chamber as that for the P-type layer 3P or in a separate chamber by means of the abovesaid CVD method using semiconductor material gas and, if necessary, hydrogen as the recombination center neutralizer. The N-type layer 3N is formed in the same reaction chamber as that for the P-type and/or I-type layer or in separate chamber by means of the above said CVD method using a semiconductor material gas and, an N-type impurity material gas, such as phosphine (PH$_3$).

The PIN structure 3 has formed thereon a reflective electrode 4. The reflective electrode 4 comprises a transparent conductive layer 4T of a conductive oxide such as indium oxide and a reflective conductive layer 4R such as aluminum which are laminated in that order. The transparent conductive layer 4T and the reflective conductive layer 4R can be deposited by the evaporation technique.

Since the above structure is apparently similar to the conventional device, no further detailed description will be given.

Figure 1:
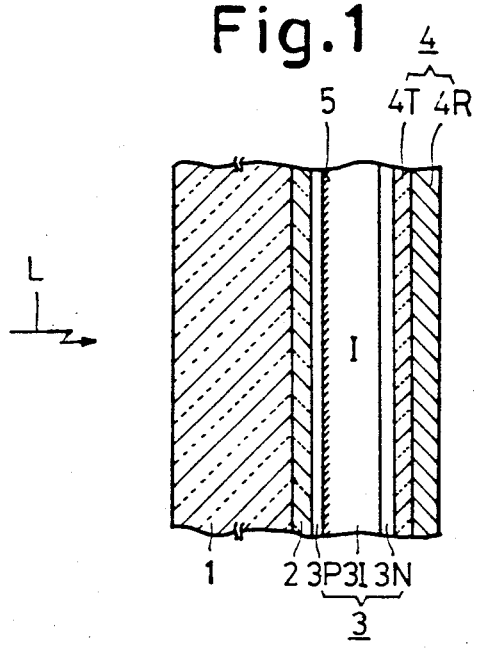
FIGS. 1, 2, 3, 4, and 5 are sectional views schematically illustrating first, second, third, fourth, and fifth embodiments of the semiconductor photoelectric conversion device of the present invention, respectively.

In the first embodiment of the present invention, shown in the FIG. 1 however, the region of the I-type layer 3I of the abovesaid PIN structure 3 in the vicinity of the boundary between it and the P-type layer 3P is crystallized as indicated by 5. The crystallized region 5 can be formed by irradiating the PIN structure 3 with annealing light through the transparent substrate 1 and transparent electrode 2. By using light having a relatively short wavelength such as 500 nm or less, only the region 5 can be crystallized without crystallizing the P-type layer 3P.

Figure 2:
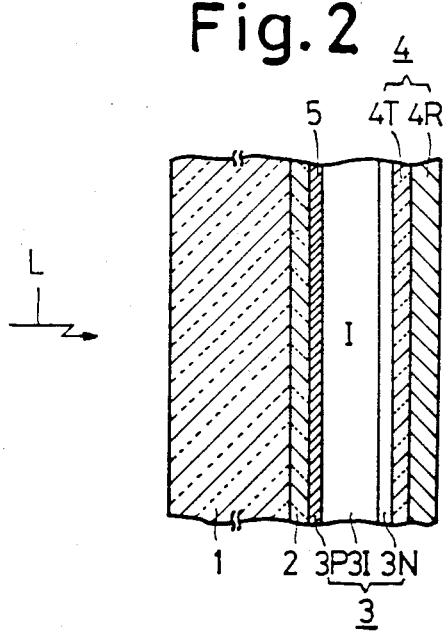

In a second embodiment shown in FIG. 2, essentially the P-type layer 3P alone is crystallized throughout its thickness. The crystallized p-type layer can be formed by irradiation of the PIN structure 3 with annealing light though the transparent substrate 1 and electrode 2 as described in conjunction with the embodiment shown in FIG. 1.

Figure 3:
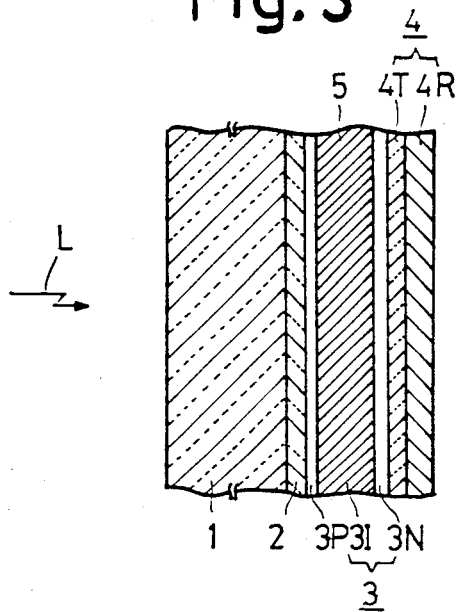

In the third embodiment depicted in FIG. 3, substantially only the I-type layer 3I is crystallized throughout its thickness. The crystallized I-type layer 3I can be formed by irradiation of the PIN structure 3 with annealing light through the transparent substrate 1 and electrode 2 as described above. In this case, however, the light has a longer wavelength such as 500 nm to 2 μm.

Figure 4:
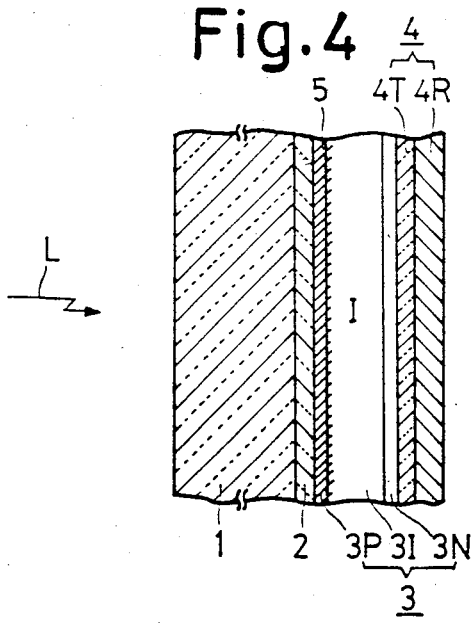

FIG. 4 illustrates a fourth embodiment of the present invention which is a combination of the first and second embodiments shown in FIGS. 1 and 2, respectively. Therefore no further description will be given.

Figure 5:
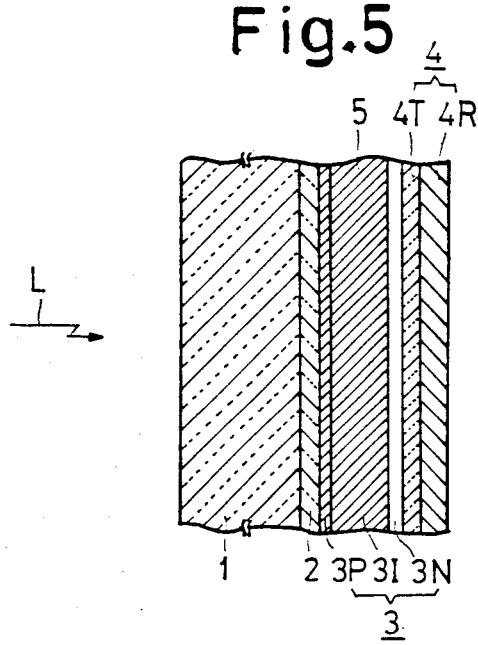

FIG. 5 illustrates a fifth embodiment of the present invention which is a combination of the second and third embodiments shown in FIGS. 2 and 3, respectively.

Figure 6:
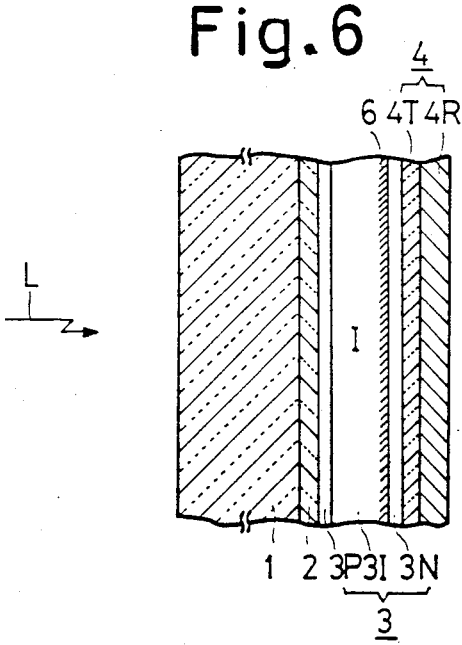
FIGS. 6, 7, and 8 are sectional views schematically illustrating sixth, seventh, and eighth embodiments of the semiconductor photoelectric conversion device of the present invention, respectively.
Figure 7:
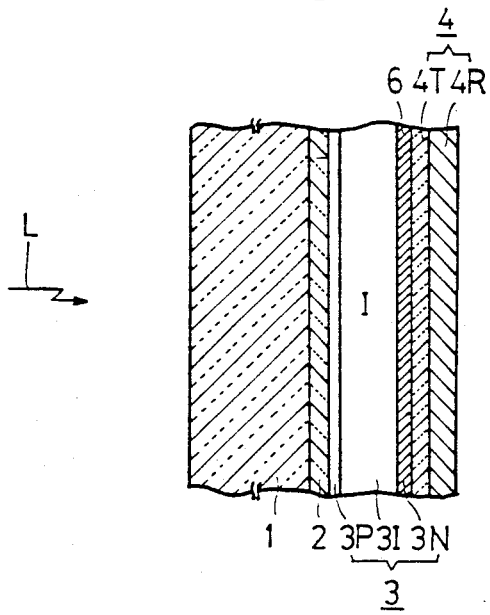
Figure 8:
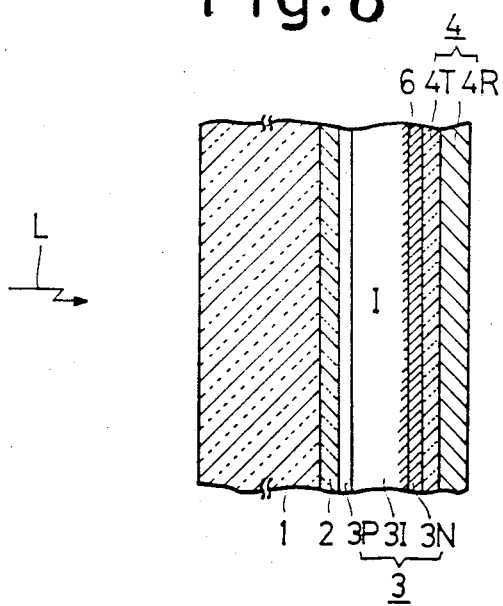

FIGS. 6, 7 and 8 illustrate sixth, seventh, and eighth embodiments of the present invention.

In FIGS. 6 to 8, the corresponding parts with FIGS. 1 to 5 are indicated by the same numeral, therefore no further detailed description will be given.

In FIG. 6, the region of the I-type layer 3I in the vicinity of the boundary between it and the N-type layer 3N is crystallized as indicated by 6.

The crystallized region 6 can be formed by irradiating the PIN structure 3 with annealing light having relatively short wave length from the side of the substrate 1 before the formation of the reflective electrode 4. Irradiation by light can also be effected through the transparent conductive layer 4T prior to the formation of the reflective conductive layer 4R of the reflective electrode 4.

FIG. 7 illustrates another embodiment in which substantially only the N-type layer is crystallized by irradiation by light as described in FIG. 6.

FIG. 8 illustrates another embodiment which is a combination of the sixth and seventh embodiments shown in FIGS. 6 and 7, respectively.

Figure 9:
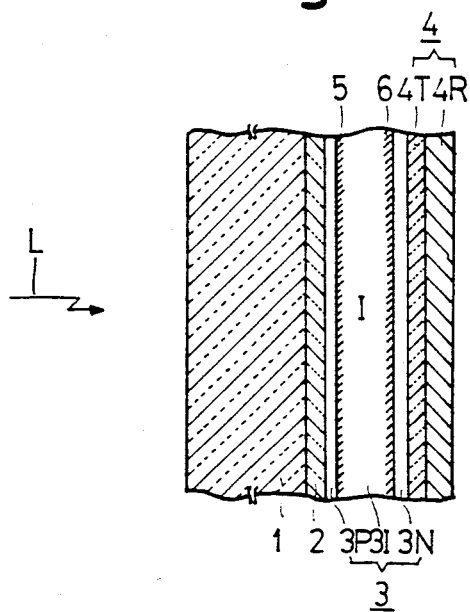
FIGS. 9, 10, 11, and 12 are sectional views schematically illustration ninth, tenth, eleventh, and twelfth embodiments of the semiconductor photoelectric conversion device of the present invention, respectively.

FIG. 9, illustrates another embodiment which is a combination of the first and sixth embodiments shown in FIGS. 1 and 6, respectively.

Figure 10:
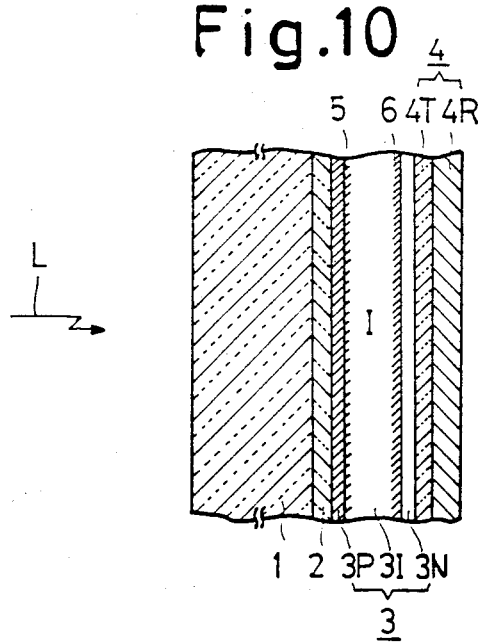

FIG. 10 illustrates another embodiment which is a combination of the fourth and sixth embodiments shown in FIGS. 4 and 6, respectively.

Figure 11:
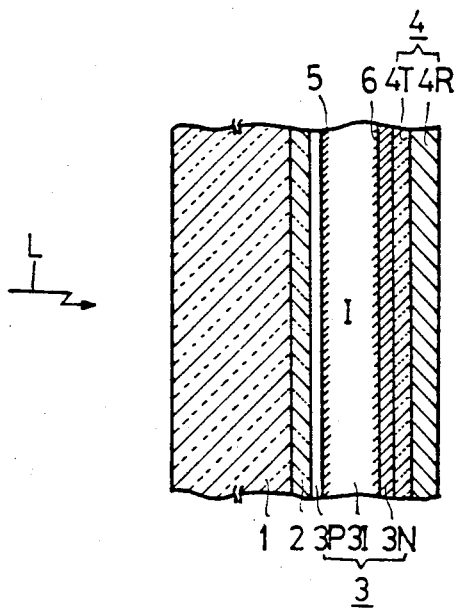

FIG. 11 illustrates another embodiment which is a combination of the first and eighth embodiments shown in FIGS. 1 and 8, respectively.

Figure 12:
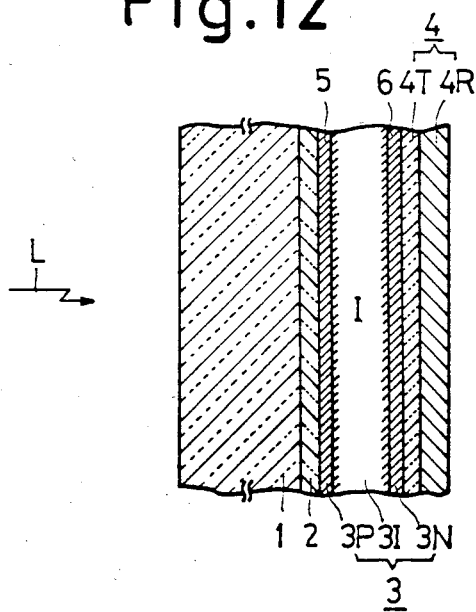

FIG. 12 illustrates another embodiment which is a combination of the fourth and eighth embodiments shown in FIGS. 4 and 8, respectively.

The above is the construction of the first type of embodiments of the semiconductor photoelectric conversion device of the present invention.

With each device of such a construction as described above, light L incident to the transparent substrate 1 passes through it and the transparent electrode 2 and enters into the I-type layer 3I through the thin P-type layer 3P of the PIN structure 3. The light having thus entered into the I-type layer 3I creates therein carriers, i.e. electron-hole pairs. The incident light L is mostly absorbed by the I-type layer 3I, but unabsorbed light passes through the N-type layer 3N and enters into the reflective electrode 4, where it is reflected back to the I-type layer 3I through the N-type layer 3N. The reflected light develops carriers in the I-type layer 3I. Of the carriers or electron-holes pairs thus created in the I-type layer 3I, electrons flow through the N-type layer 3N to reach the reflective electrode 4, whereas holes flow through the P-type layer 3P to reach the transparent electrode 2. By the abovesaid mechanism, photovoltaic power is generated across the electrodes 2 and 4.

Figure 13:
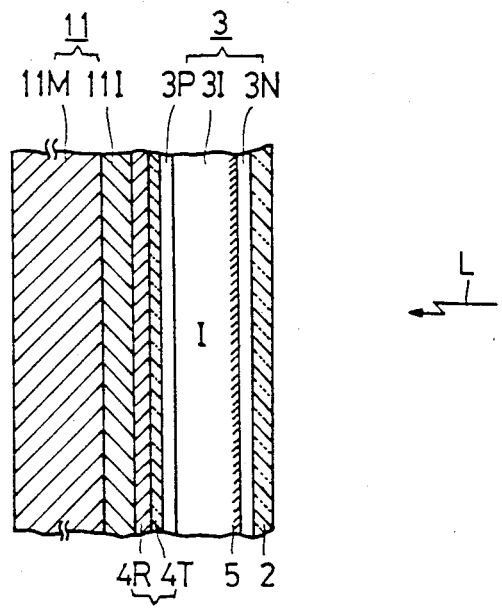
FIGS. 13 and 14 are sectional views schematically illustrating thirteenth and fourteenth embodiments of the semiconductor photoelectric conversion device and the method of making the same.
Figure 14:
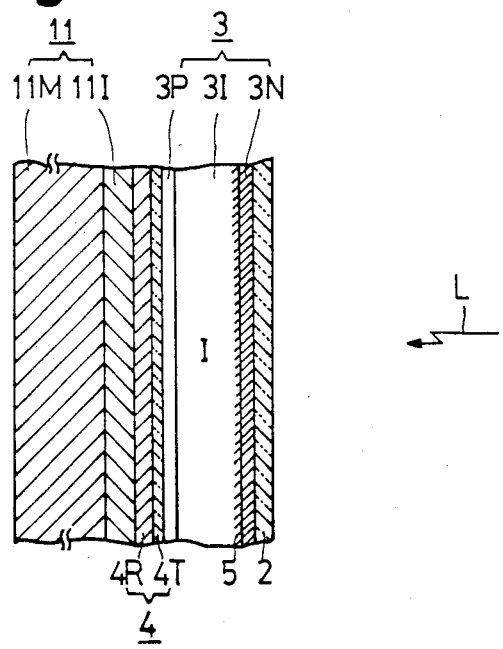

FIGS. 13 and 14 illustrate thirteenth and fourteenth embodiments of the semiconductor photoelectric conversion device of the present invention, in which like parts corresponding to those in FIG. 1 are identified by the same reference numerals and detailed description thereof will not be repeated.

In this embodiment, the same reflective electrode 4, the same PIN structure 3, and the same transparent electrode 2 as those described in connection with FIG. 1 are sequentially laminated in that order on a substrate 11 having structure member 11M as of stainless steel and an insulating film 11I such as of heat resistant resin deposited on substrate member 11M. In this case, the reflective electrode 4 has the same construction comprising reflective conductive layer 4R and transparent conductive layer 4T as described previously with respect to FIG. 1 laminated in that order on the insulating film 11I. The PIN structure 3 has a construction wherein the same N-type, I-type and P-type layers 3N, 3I, and 3P as those described previously with respect to FIG. 1 are laminated in that order on the reflective electrode 4.

According to abovesaid embodiments, by light L incident to the device on the side of the transparent electrode 2, photovoltaic power can be generated across the transparent electrode 2 and the reflective electrode 4 through the same mechanism as described previously in conjunction with FIGS. 1 to 12.

The semiconductor photoelectric conversion device of the present invention described above has the above-said crystallized region in the PIN structure 3, and hence produces the excellent effects referred to previously.

Further, the manufacturing method of the present invention permits easy fabrication of such a semiconductor photoelectric conversion device as mentioned above.

The foregoing embodiments should be construed as being merely illustrative of the present invention and should not be construed as limiting the invention specifically thereto.

It will be apparent that many modifications and variations may be effected without departing from the scope of the novel concepts of the present invention.

What is claimed is:

1. A method for manufacturing a semiconductor photoelectric conversion device comprising the steps of:

forming a first impurity doped non-single crystal semiconductor layer of a first conductivity type on a substrate;

forming an intrinsic non-single crystal semiconductor layer on said first semiconductor layer;

forming a second impurity doped non-single crystal semiconductor layer of a second conductivity type opposite to said first conductivity type on said intrinisc layer;

irradiating the outer surface of said second impurity doped semiconductor layer with light energy of suitable wavelength which is effective to selectively crystallize said second impurity doped layer;

irradiating the outer surface of said second impurity doped semiconductor layer with light energy of suitable wavelength which is effective to selectively crystallize said intrinsic semiconductor layer, whereby only the portion of said intrinsic semiconductor layer adjacent said second impurity doped semiconductor layer is crystallized.

* * * * *